United States Patent
Shen et al.

(10) Patent No.: US 9,159,685 B2
(45) Date of Patent: Oct. 13, 2015

(54) CONDUCTIVE STRUCTURE AND METHOD FOR FORMING THE SAME

(71) Applicant: CHIPMOS TECHNOLOGIES INC., Hsinchu (TW)

(72) Inventors: Geng-Shin Shen, Hsinchu (TW); Chung-Pang Chi, Hsinchu (TW)

(73) Assignee: CHIPMOS TECHNOLOGIES INC., Hsinchu (TW)

( * ) Notice: Subject to any disclaimer, the term of this patent is extended or adjusted under 35 U.S.C. 154(b) by 0 days.

(21) Appl. No.: 14/494,026

(22) Filed: Sep. 23, 2014

(65) Prior Publication Data

US 2015/0011082 A1    Jan. 8, 2015

Related U.S. Application Data

(62) Division of application No. 13/654,710, filed on Oct. 18, 2012, now Pat. No. 8,872,336.

(30) Foreign Application Priority Data

Nov. 18, 2011    (TW) .............................. 100142186 A

(51) Int. Cl.
*H01L 21/44*    (2006.01)
*H01L 23/00*    (2006.01)

(52) U.S. Cl.
CPC ................ *H01L 24/11* (2013.01); *H01L 24/03* (2013.01); *H01L 24/05* (2013.01); *H01L 24/13* (2013.01); *H01L 24/16* (2013.01); *H01L 2224/034* (2013.01); *H01L 2224/03602* (2013.01); *H01L 2224/0401* (2013.01); *H01L 2224/05022* (2013.01); *H01L 2224/05027* (2013.01); *H01L 2224/05073* (2013.01);

(Continued)

(58) Field of Classification Search
CPC ..................... H01L 24/11; H01L 2224/11462; H01L 21/768; H01L 2224/11825
USPC ........................................... 438/614; 257/737
See application file for complete search history.

(56) References Cited

U.S. PATENT DOCUMENTS 6,103,552 A    8/2000  Lin
6,720,244 B2   4/2004  Tong et al.
(Continued)

FOREIGN PATENT DOCUMENTS

| CN | 101355078 A | 1/2009 |
| JP | 2003-203940 A | 7/2003 |
| TW | 201005841 A | 2/2010 |

*Primary Examiner* — Theresa T Doan
(74) *Attorney, Agent, or Firm* — Muncy, Geissler, Olds & Lowe, P.C.

(57) ABSTRACT

A conductive structure for a semiconductor chip and a method for forming the conductive structure are provided. The semiconductor chip comprises a semiconductor substrate, a pad, a passivation layer and a patterned insulating layer. The patterned insulating layer is disposed on the passivation layer and partially and directly covers the first opening of the pad to expose a second opening. The conductive structure comprises an under bump metal (UBM) layer and a conductive bump. The UBM layer is disposed in the second opening defined by the patterned insulating layer and is electrically connected to the pad. The conductive bump is disposed on the UBM layer and is electrically connected to the UBM layer. The upper surface of the conductive bump is greater than the upper surface of the patterned insulating layer, while the portion of the conductive bump disposed in the second opening is covered by the UBM layer.

6 Claims, 4 Drawing Sheets

(52) U.S. Cl.
CPC ............... *H01L 2224/05144* (2013.01); *H01L 2224/05147* (2013.01); *H01L 2224/05166* (2013.01); *H01L 2224/05172* (2013.01); *H01L 2224/05184* (2013.01); *H01L 2224/05571* (2013.01); *H01L 2224/05573* (2013.01); *H01L 2224/05639* (2013.01); *H01L 2224/05644* (2013.01); *H01L 2224/05647* (2013.01); *H01L 2224/1132* (2013.01); *H01L 2224/1148* (2013.01); *H01L 2224/1184* (2013.01); *H01L 2224/11462* (2013.01); *H01L 2224/11831* (2013.01); *H01L 2224/11845* (2013.01); *H01L 2224/133* (2013.01); *H01L 2224/13022* (2013.01); *H01L 2224/1329* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16227* (2013.01); *H01L 2924/00014* (2013.01); *H01L 2924/01022* (2013.01); *H01L 2924/01023* (2013.01); *H01L 2924/01029* (2013.01); *H01L 2924/01047* (2013.01); *H01L 2924/01074* (2013.01); *H01L 2924/01079* (2013.01)

(56) References Cited

U.S. PATENT DOCUMENTS

| | | |
|---|---|---|
| 6,924,553 B2 | 8/2005 | Ohara |
| 2005/0087885 A1 | 4/2005 | Jeong |
| 2006/0170102 A1* | 8/2006 | Ko .................................. 257/738 |
| 2007/0176175 A1* | 8/2007 | Shioga et al. .................. 257/40 |
| 2008/0122081 A1 | 5/2008 | Kim et al. |
| 2009/0026608 A1 | 1/2009 | Tsai et al. |

* cited by examiner

CONDUCTIVE STRUCTURE AND METHOD FOR FORMING THE SAME

CROSS REFERENCE TO RELATED APPLICATIONS

This application is a Divisional of co-pending application Ser. No. 13/654,710, filed on Oct. 18, 2012, for which priority is claimed under 35 U.S.C. §120; and this application claims priority of Application No. 100142186 filed in Taiwan on Nov. 18, 2011 under 35 U.S.C. §119, the entire contents of all of which are hereby incorporated by reference.

BACKGROUND OF THE INVENTION

1. Field of the Invention

The present invention provides a conductive structure and a method for forming the same, and more particularly, to a conductive structure for a semiconductor chip and a method for forming the conductive structure.

2. Descriptions of the Related Art

Flip chip packaging has gradually become the mainstream process for semiconductor packaging. According to flip chip bonding technology, a chip is flipped over upside down, and then the bumps that are formed on the chip are used as bridges for an electrical connection between the chip and circuit of a counter substrate. Therefore, the quality of the bumps used as conductive structures is critical for the overall performance of semiconductor package products.

FIGS. 1A to 1F illustrate conventional bump structures and steps of forming the same. First, as shown in FIG. 1A, the chip 11 consists of a substrate 111, a pad 112 and a passivation layer 113. The passivation layer 113 is formed with a first opening 113a to partially expose the pad 112.

To attach the bump to the pad 112 successfully, an Under Bump Metal (UBM) 121 must be formed on the passivation layer 113 in advance as shown in FIG. 1B. The UBM 121 is electrically connected to the pad 112 through the first opening 113a formed in the passivation layer 113. Thus, the UBM 121 not only has the function of bonding the bump to the pad 112, but also serves as a conductive media between the bump and the pad 112.

Then, as shown in FIG. 1C, an insulating layer 122 is formed on the UBM 121, and depending on the design requirements, a photoresist is then used to appropriately form a second opening 122a above the pad 112 through patterning for use in a subsequent bump implanting step.

Therefore, depending on the design requirements, a bump 123 is formed within the second opening 122a of the insulating layer 123 through electroplating or evaporating or some other process and is electrically connected to the pad 112 through the UBM 121, as shown in FIG. 1D.

Upon completion of the step of implanting the bump 123, some portions of the insulating layer 122 have become unnecessary, so these unnecessary portions of the insulating layer 122 are removed as shown in FIG. 1E.

Finally, to block electrical connection between the wafer components in the substrate 111 and external components via the UBM 121, portions of the UBM 121 other than the portion under the bump 123 are removed through UBM etching as shown in FIG. 1F, thus, completing the bump structure of the conventional chip 11.

However, in the above manufacturing process, the insulating layer 122 and the second opening 122a defined therein are only used as pre-steps for the subsequent step of implanting the bump 123. Therefore, the insulating layer 122 becomes unnecessary after the bump 123 is formed. This makes it difficult to make proper use of the insulating layer 122 and leads to several additional procedures and associated costs: the photoresist is used to remove the insulating layer 122, and then the residual photoresist or foreign matters on the surface of the chip 11 must be cleaned off before removing portions of the UBM 121.

Furthermore, the UBM 121 usually consists of two metal layers. Conventionally, the two metal layers are used as adhesion layers between the pad 112 and the bump 123 by virtue of conductivity of the metals and the different element properties of the metal layers. However, the conventional UBM 121 bonds to the pad 112 and the bump 123 using only the surfaces of the two metal layers. Consequently, in the case of poor quality control of the two metal layers, cracks easily occur between the UBM 121 and the bump 123 or between the UBM 121 and the pad 112 to result in an instable conductive effect of the bump 123, which will adversely affect the working performance of the whole chip 11.

Accordingly, it is important to improve the quality of the bump and decrease the cost of the overall manufacturing process.

SUMMARY OF THE INVENTION

An objective of the present invention is to provide a conductive structure for a semiconductor chip. The semiconductor chip comprises a semiconductor substrate, a pad, a passivation layer and a patterned insulating layer. The pad is disposed on the semiconductor substrate, the passivation layer is disposed on both the semiconductor substrate and the pad to expose a first opening, and the patterned insulating layer is disposed on the passivation layer and partially and directly covers the first opening of the pad to expose a second opening. The first opening is larger than the second opening. The conductive structure comprises an under bump metal (UBM) layer and a conductive bump. The UBM layer is formed in the second opening defined by the patterned insulating layer and electrically connected to the pad. The conductive bump is formed on the under bump metal layer and electrically connected to the under bump metal layer. An upper surface of the conductive bump is higher than the upper surface of the patterned insulating layer. The portion of the conductive bump disposed in the second opening is covered by the under bump metal layer. Thereby, a stable bond and a good electrical connection can be achieved between the conductive bump, the under bump metal layer and the pad.

Another objective of the present invention is to provide a method for forming a conductive structure, and particularly, a method for forming a conductive structure that can decrease the overall manufacturing cost. To this end, the method for forming a conductive structure of the present invention comprises the following steps: (10 forming a patterned insulating layer on a passivation layer of a semiconductor chip, with the patterned insulating layer partially and directly covering the first opening of a pad to expose a second opening that is smaller than the first opening, wherein the semiconductor chip comprises a semiconductor substrate, a pad, disposed on the semiconductor substrate, and a passivation layer, disposed on the semiconductor substrate and the pad to expose the first opening; forming an under bump metal (UBM) layer covering the patterned insulating layer and the second opening thereof to electrically connect to the pad; and forming a conductive bump disposed in the second opening to electrically connect to the under bump metal layer, wherein the under bump metal layer covers a periphery of the conductive bump; and removing the under bump metal layer disposed in an external region layer, wherein an upper surface of the conductive bump is higher than an upper surface of the under bump metal layer, and the portion of the conductive bump disposed in the second opening is covered by the under bump metal layer. In other words, the conductive bump is covered by the under bump metal layer in regions that are not higher than the patterned insulating layer. The external region layer refers to a region located outside the second opening.

According to the above descriptions, the present invention changes the manufacturing process sequences of the conventional conductive structure and keeps the insulating layer, which would otherwise be removed in the prior art, for use as an auxiliary fixing component of the conductive structure and an insulating barrier of the semiconductor chip. In this way, the conductive stability of the conductive structure can be enhanced and the number of unnecessary manufacturing steps can be reduced to save the cost.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, the present invention will be explained with reference to embodiments thereof. However, the description of these embodiments is only intended to illustrate the technical contents, objectives and effects of the present invention rather than to limit the present invention. It should be appreciated that in the following embodiments and attached drawings, elements unrelated to the present invention are omitted from depiction; and dimensional relationships and positional relationships among individual elements in the attached drawings are illustrated only for ease of understanding, but not to limit the actual scale and dimensions.

Figure 1A:
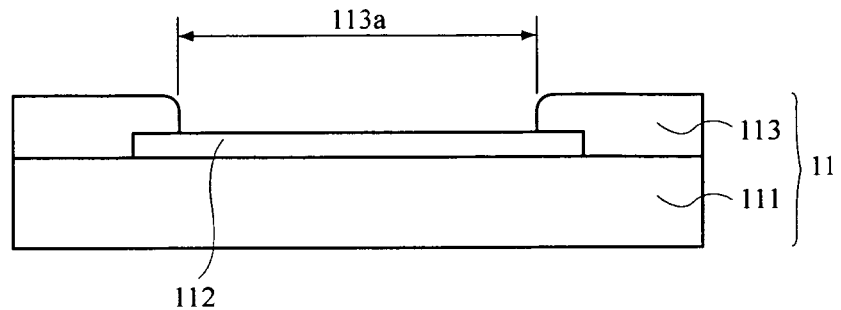
FIGS. 1A-1F are schematic views of a conventional conductive structure and a method for forming the same.
Figure 1B:
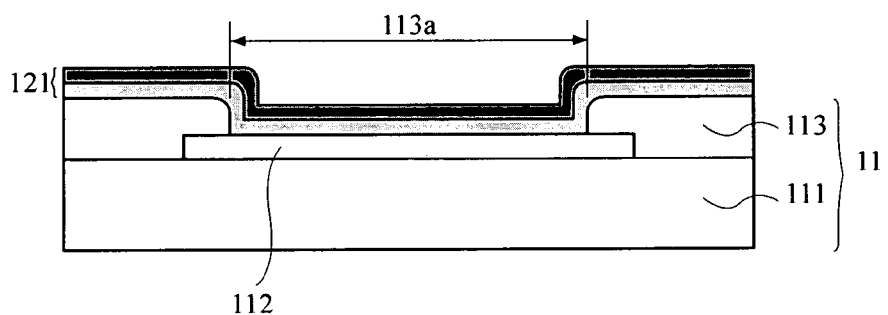
Figure 1C:
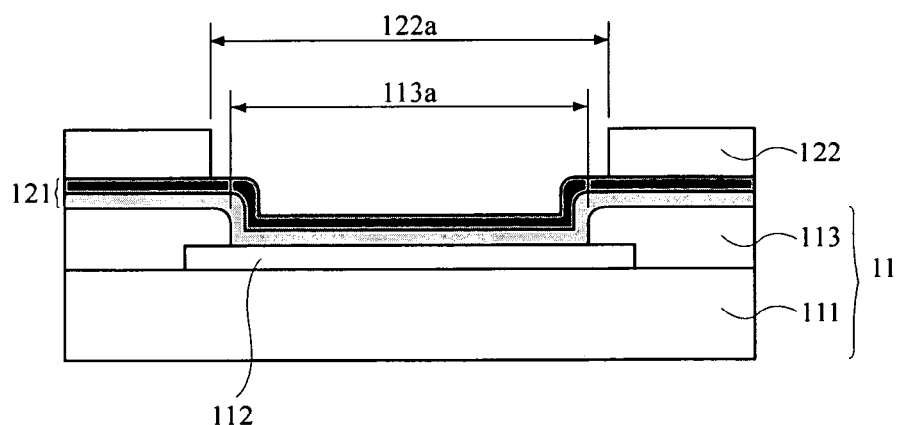
Figure 1D:
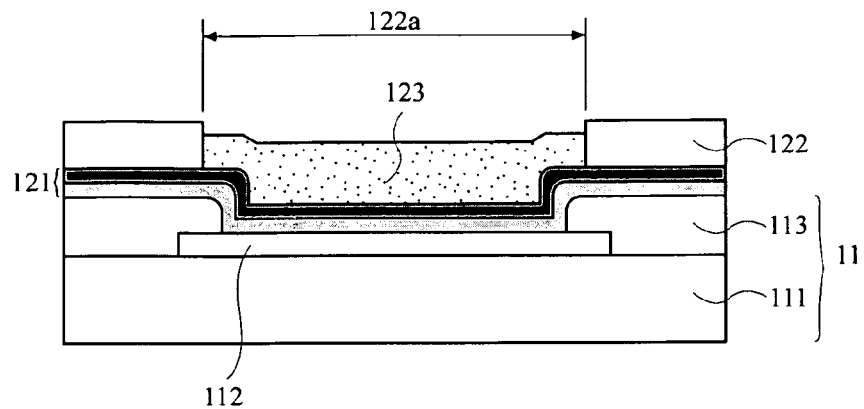
Figure 1E:
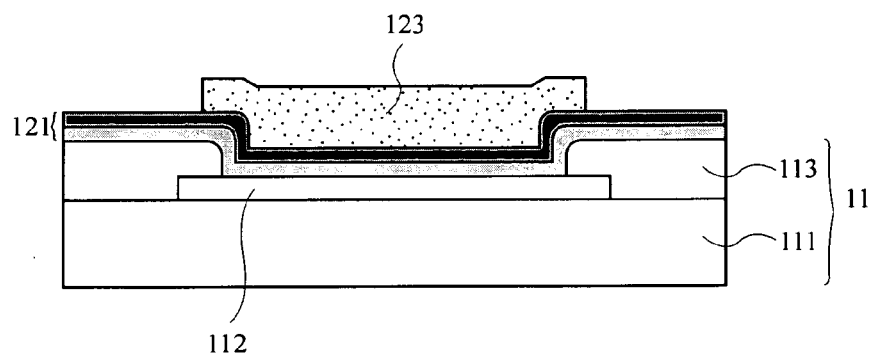
Figure 1F:
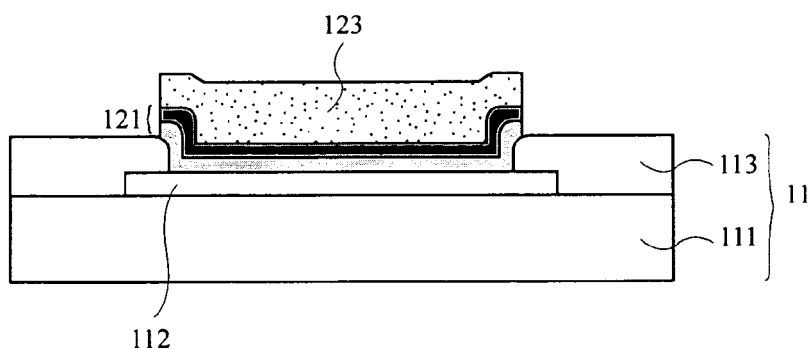
Figure 2A:
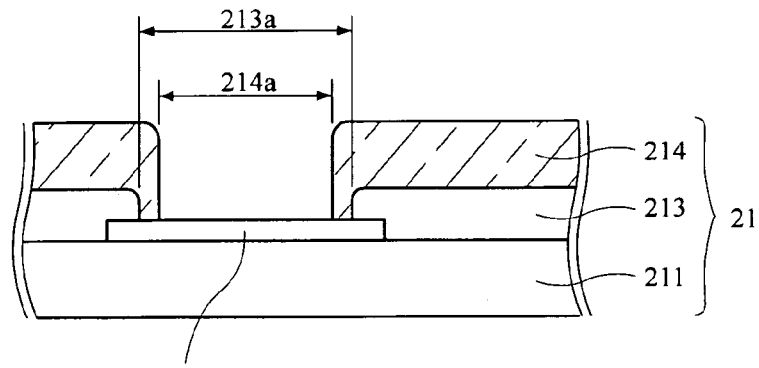
FIGS. 2A-2D are schematic views of a conductive structure and a method for forming the same according to the present invention.
Figure 2B:
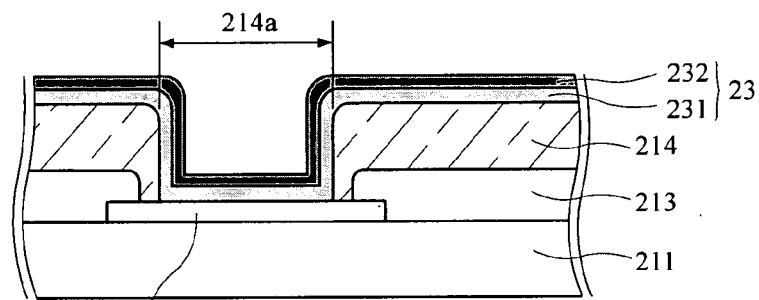
Figure 2C:
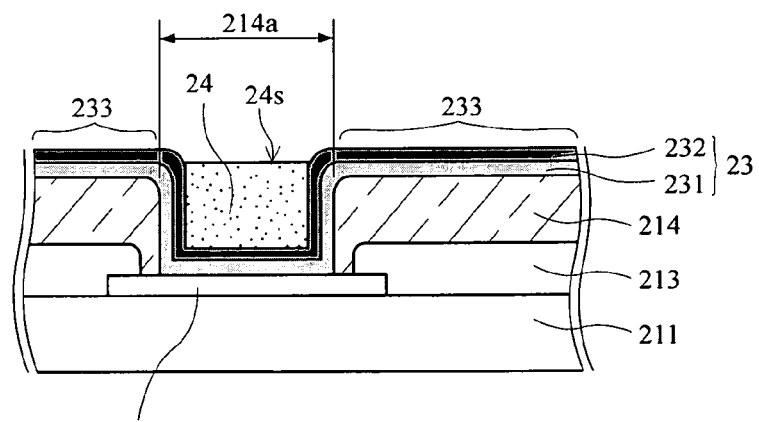
Figure 2D:
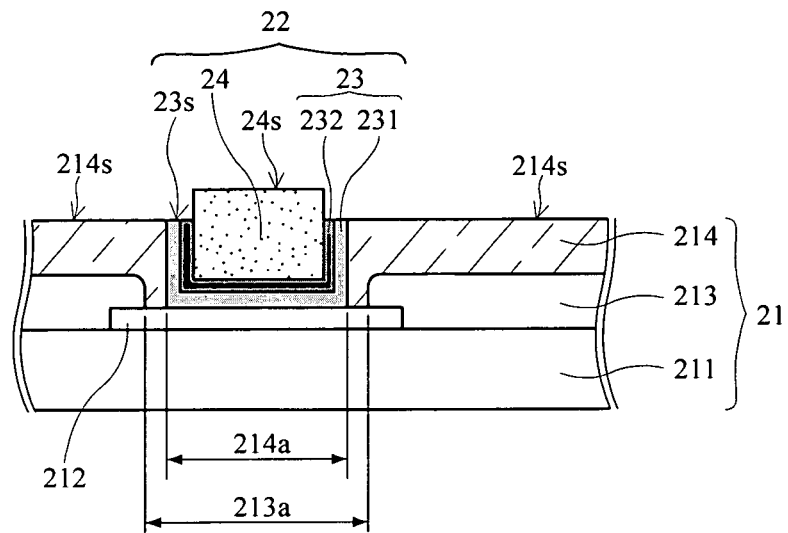

FIGS. 2A to 2D are schematic views illustrating the process of forming a conductive structure 22 according to the preferred embodiment of the present invention. Particularly, FIG. 2D is a schematic view of the conductive structure 22 that has been completely formed. As shown in FIG. 2D, the conductive structure 22 of this embodiment comprises an under bump metal (UBM) layer 23 and a conductive bump 24. The UBM 23 is disposed in a second opening 214a defined by a patterned insulating layer 214 and electrically connected to a pad 212. The conductive bump 24 is disposed on the UBM 23 and electrically connected to the UBM layer 23. An upper surface 24s of the conductive bump 24 is higher than the upper surface 214s of the patterned insulating layer 214. The portion of the conductive bump 24 disposed in the second opening 214a is covered by the UBM layer 23; that is, the UBM layer 23 covers regions of the conductive bump 24 other than the upper surface 214s.

In this embodiment, the upper surface 24s of the conductive bump 24 is higher than the upper surface 214s of the patterned insulating layer 214 by about 2 to 5 micrometers (μm). The UBM layer 23 comprises a first conductor layer 231 and a second conductor layer 232. The first conductor layer 231 is disposed in the second opening 214a and electrically connected to the pad 212, while the second conductor layer 232 is disposed on the first conductor layer 231 and electrically connected to the first conductor layer 231.

FIGS. 2A to 2D are schematic views illustrating a method for forming the conductive structure according to the aforesaid preferred embodiment, which will be described in sequence hereinbelow.

First, with reference to FIG. 2A, a semiconductor chip 21 comprises a semiconductor substrate 211, a pad 212, a passivation layer 213 and a patterned insulating layer 214. The pad 212 is disposed on the semiconductor substrate 211, while the passivation layer 213 is disposed on the semiconductor substrate 211 and the pad 212 to expose a portion of the pad 212 to define a first opening 213a. As will be appreciated by those of ordinary skill in the art, the pad 212 is preferably made of Au, Cu or some other metal material so that it can be used as a contact for electrical conduction between the semiconductor chip 21 and an external circuit.

It shall be particularly appreciated that unlike the process of forming the conventional conductive structure in which the under bump metal layer and the patterned insulating layer are firstly formed in sequence before the conductive bump is formed, the method for forming the conductive structure of the present invention is unique in that the patterned insulating layer 214 is firstly formed on the passivation layer 213 to partially and directly cover the first opening 213a of the pad 212 and to form another opening (i.e., the second opening 214a) above the pad 212. The first opening 213a is larger than the second opening 214a. In this embodiment, the patterned insulating layer 214 is preferably made of polyimide (PI), a solder resist (SR), benzocyclobutene (BCB), or a siloxane polymer. Then, depending on the practical needs, a photolithographic or etching process may be used to form the second opening 214a through patterning; and further, the patterned insulating layer 214 is cured. It shall be further noted that the siloxane polymer used in this embodiment is a material of the SINR series manufactured by Shin-Etsu Chemical Co., Ltd.

With further reference to FIG. 2B, after patterning the insulating layer 214, the UBM layer 23 can be formed to cover the patterned insulating layer 214 and the second opening 214a defined by the patterned insulating layer 214. In this way, the UBM layer 23 can be electrically connected to the pad 212 via the second opening 214a defined by the patterned insulating layer 214.

More specifically, the UBM layer 23 consists of the first conductor layer 231 and the second conductor layer 232. The first conductor layer 231 is firstly formed to cover the patterned insulating layer 214 and the second opening 214a and to electrically connect with the pad 212. Then, the second conductor layer 232 is formed to cover the first conductor layer 231 and to electrically connect with the first conductor layer 231. As will be appreciated by those of ordinary skill in the art, the first conductor layer 231 is preferably made of titanium (Ti), wolfram (W), vanadium (V) or an alloy thereof, which can not only prevent metal diffusion between the second conductor layer 232 and the pad 212 but also enhance the adhesion therebetween. The second conductor layer 232 is preferably made of Au, Cu, Ag or an alloy thereof, which can improve the electrical conduction between the pad 212 and the conductive bump. However, the materials of the first conductor layer and the second conductor layer of the present invention are not limited to what is described above, and any conductive materials can be used in the present invention.

With further reference to FIG. 2C, the conductive bump 24 is formed in the second opening 214a to electrically connect to the UBM layer 23 with the conductive bump 24 being covered by the UBM layer 23. More specifically, the conductive bump 24 is preferably formed through an electroplating process, and the conductive bump 24 may be made of Au, Cu, Ag, Ni or an alloy thereof. In other embodiments, the conductive bump may be a bump made of a conductive polymer through a printing process or an adhesive dripping process.

Figure 3:
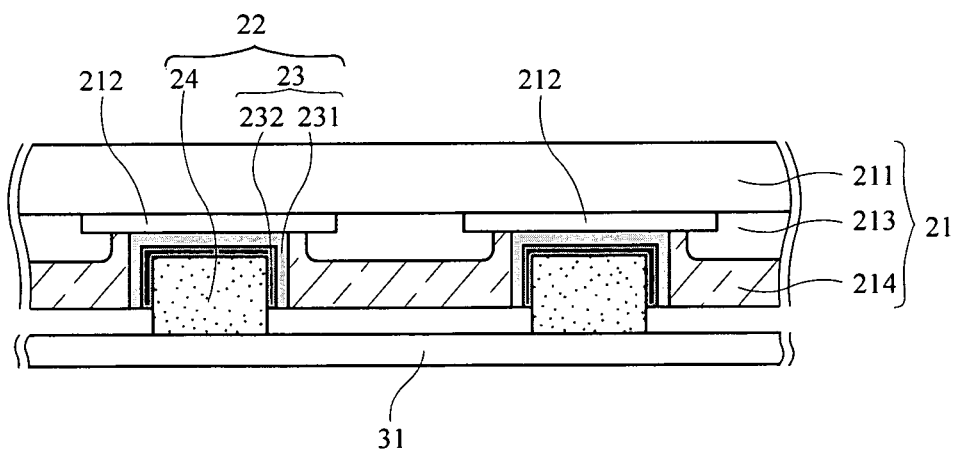
FIG. 3 is a schematic view illustrating the connections between a semiconductor chip comprising the conductive structure of the present invention and a substrate.

For ease of description, the region outside the second opening 214a is defined as an external region layer 233 as shown in FIG. 2C; in detail, the external region layer 233 refers to the UBM layer 23 above the patterned insulating layer 214. The whole conductive bump 24 is covered by the UBM layer 23 and, thus, is still unable to be connected to an external substrate, the external region layer 233 must be removed. More specifically, because the conductive bump 24 has a hardness greater than the UBM layer 23, the external region layer 233 of the under bump metal layer 23 is easier to be removed. Therefore, a lapping process, a plasma etching process or a chemical mechanical polishing (CMP) process will be performed next to remove the UBM layer 23 in the external region layer 233. After the external region layer 233 is removed, the upper surface 24s of the conductive bump 24 becomes higher than the upper surface 23s of the under bump metal layer 23 and the portion of the conductive bump 24 disposed in the second opening 214a is covered by the under bump metal layer 23 as shown in FIG. 2D. More specifically, the under bump metal layer 23 above the patterned insulating layer 214 has been removed, and only the under bump metal layer 23 disposed in the second opening 214a is left to cover the conductive bump 24, with the upper surface 23s of the under bump metal layer 23 being flush with the upper surface 214s of the patterned insulating layer 214. Therefore, in the conductive structure 22 that has been completely formed, the patterned insulating layer 214 has a thickness of about 2 to 20 μm, and the upper surface 24s of the conductive bump 24 is greater than the upper surface 214s of the patterned insulating layer 214 by about 2 to 5 μm. Finally, as shown in FIG. 3, the conductive bump 24 of the conductive structure 22 can be bonded to a circuit (not shown) of a counter substrate 31.

As compared to the process of forming a conventional conductive structure where unnecessary portions of the patterned insulating layer must be removed, the present invention keeps the patterned insulating layer and cures it for use as a barrier between the semiconductor chip and the external substrate. This can reduce the number of steps of the manufacturing process and make proper use of the patterned insulating layer.

Furthermore, because the UBM layer covers the lower half of the conductive bump and the cured patterned insulating layer supports the UBM layer and the conductive bump, the conductive area between the conductive bump and the UBM layer is increased and the bonding structure of the UBM layer is strengthened. This can prevent cracks between the conductive bump and the UBM layer or between the pad and the UBM layer from happening, so the semiconductor chip and the conductive structure of the present invention have a high yield and good electrical conductivity.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed:

1. A method for forming a conductive structure comprising:
   forming a patterned insulating layer above a passivation layer of a semiconductor chip, wherein the semiconductor chip comprises a semiconductor substrate, a pad and the passivation layer, wherein the pad is disposed on the semiconductor substrate, the passivation layer is disposed on the semiconductor substrate partially covers the pad to expose the pad through a first opening that is formed by the passivation layer, and the patterned insulating layer is disposed on the passivation layer and partially covers the first opening to expose the pad through a second opening that is defined by the patterned insulating layer, wherein the first opening is larger than the second opening;
   forming an under bump metal (UBM) layer covering the patterned insulating layer and the second opening to electrically connect to the pad; and
forming a conductive bump disposed in the second opening to electrically connect to the under bump metal layer, wherein the under bump metal layer covers a periphery of the conductive bump; and
   removing the under bump metal layer disposed in an external region layer outside the second opening of the patterned insulating layer, thereby a first upper surface of the under bump metal layer is flush with a second upper surface of the patterned insulating layer, a third upper surface of the conductive bump is higher than the first upper surface of the under bump metal layer, and the portion of the conductive bump disposed in the second opening is covered by the under bump metal layer.

2. The method as claimed in claim 1, wherein the step of forming a patterned insulating layer further comprises a step of curing the patterned insulating layer.

3. The method as claimed in claim 1, wherein the third upper surface of the conductive bump is higher than the second upper surface of the patterned insulating layer by about 2 to 5 micrometers.

4. The method as claimed in claim 1, wherein the conductive bump is formed by an electroplating process.

5. The method as claimed in claim 1, wherein the step of forming an under bump metal layer comprises:
   forming a first conductor layer covering the patterned insulating layer and the second opening to electrically connect to the pad; and
   forming a second conductor layer covering the first conductor layer to electrically connect to the first conductor layer.

6. The method as claimed in claim 1, wherein the step of removing the under bump metal layer disposed in the external region layer is performed by one of a lapping process, a plasma etching process and a chemical mechanical polishing process.

* * * * *